(12) United States Patent
Tang et al.

(10) Patent No.: US 7,271,606 B1
(45) Date of Patent: Sep. 18, 2007

(54) SPRING-BASED PROBE PIN THAT ALLOWS KELVIN TESTING

(75) Inventors: Tze Kang Tang, Melaka (MY); Sek Hoi Chong, Melaka (MY); Chin Chai Gan, Melaka (MY); Hai Ching Tan, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/197,916

(22) Filed: Aug. 4, 2005

(51) Int. Cl.
*G01R 31/02* (2006.01)
*G01R 27/08* (2006.01)
*G01R 31/28* (2006.01)

(52) U.S. Cl. .................. 324/761; 324/715; 324/754; 324/158.1

(58) Field of Classification Search ........... 324/754, 324/755, 715, 761, 158.1
See application file for complete search history.

(56) References Cited

U.S. PATENT DOCUMENTS

| | | | |
|---|---|---|---|
| 4,027,935 A * | 6/1977 | Byrnes et al. ........... 439/289 |
| 4,622,514 A * | 11/1986 | Lewis .................... 324/761 |
| 4,764,026 A * | 8/1988 | Powell et al. ............ 374/178 |
| 5,500,605 A * | 3/1996 | Chang .................... 324/758 |
| 5,641,945 A | 6/1997 | Abe et al. ............... 174/261 |
| 6,150,830 A * | 11/2000 | Schmid et al. ........... 324/761 |
| 6,257,911 B1 | 7/2001 | Shelby et al. ........... 439/268 |
| 6,291,897 B1 * | 9/2001 | Wark et al. ............. 257/786 |
| 6,411,112 B1 * | 6/2002 | Das et al. ............... 324/754 |
| 6,462,572 B2 * | 10/2002 | Takahashi ............... 324/755 |
| 6,471,524 B1 * | 10/2002 | Nakano et al. .......... 439/70 |
| 6,530,148 B1 * | 3/2003 | Kister ................... 29/842 |
| 6,552,554 B1 * | 4/2003 | Prinz et al. ............. 324/719 |
| 6,714,029 B2 | 3/2004 | Prasad-Roth ............ 324/754 |
| 6,768,331 B2 | 7/2004 | Longson et al. ......... 324/761 |
| 6,791,344 B2 * | 9/2004 | Cook et al. ............. 324/754 |
| 2005/0179455 A1 * | 8/2005 | Cooper et al. ........... 324/754 |

\* cited by examiner

*Primary Examiner*—Ernest Karlsen
*Assistant Examiner*—Roberto Velez
(74) *Attorney, Agent, or Firm*—Mark C. Pickering

(57) ABSTRACT

The voltage at a node of an integrated circuit can be measured or controlled using a two-wire kelvin contact with spring-based probe pins by offsetting and tapering the lower end section of the spring-based probe pin. As a result, multiple spring-based probe pins can be connected to a single contact bump, such as a solder bump.

14 Claims, 3 Drawing Sheets

SPRING-BASED PROBE PIN THAT ALLOWS KELVIN TESTING

BACKGROUND OF THE INVENTION

1. Field of the Invention

The present invention relates to probe pins and, more particularly, to a spring-based probe pin that allows kelvin testing.

2. Description of the Related Art

A bumped die package is a package that eliminates the need for wire bonding and molding. With a bumped die process, solder bumps are mounted to the bond pads of a wafer, which is then diced to form a large number of individual die. Once diced, an individual die is ready to be used by a customer.

Final electrical testing is performed using a test and evaluation circuit that includes a number of probe pins. In operation, the probe pins are brought into electrical contact with the solder bumps. Voltages and currents are then applied to the solder bumps via the probe pins so that the proper operation of the circuits can be verified.

In current-generation test and evaluation circuits, the probe pins are commonly implemented as pogo pins or cantilever pins. A pogo pin is typically implemented as a cylindrically-shaped structure that houses a spring, although other types of spring-based probe pins can alternately be used.

FIG. 1 shows a cross-sectional diagram that illustrates an example of a prior-art, non-cylindrical, spring-based probe pin 100. As shown in the FIG. 1 example, probe pin 100 is implemented as a single metal element that has a top end section 110, a bottom end section 112, and a C-shaped section 114 that connects sections 110 and 112 together.

FIG. 2 shows a cross-sectional diagram that illustrates an example of a prior-art electrical test. As shown in FIG. 2, a test and evaluation circuit 210 is utilized to verify the electrical operation of the circuits on a wafer 212, which has a large number of solder bumps 214 attached to the pads of wafer 212.

Test and evaluation circuit 210, in turn, includes a printed circuit board (PCB) 210A, a socket 210B that is connected to PCB 210A, and a large number of probe pins 216 that are connected to PCB 210A and socket 210B. Each probe pin 216, in turn, is implemented as a probe pin 100, and has a top end section 220 that is electrically connected to PCB 210A, and a bottom end section 222 that is connected to a solder bump 214 during a test.

In operation, when a force is applied to bring a solder bump 214A and a probe pin 216A into electrical contact, solder bump 214A and probe pin 216A approach each other along a line parallel to a line 224 that passes through the center and apex of solder bump 214A. When probe pin 216A contacts the apex of solder bump 214A, the C-shaped section of probe pin 216A functions as a spring that absorbs some of the contact force, thereby reducing any damage to solder bump 214A that may result from the contact.

When testing, solder bump-to-probe pin misalignment errors are to be avoided as a misalignment error which causes probe pin 216A to miss the apex of solder bump 214A can cause severe damage to solder bump 214A. One significant disadvantage of probe pin 216A, and pogo pins in general, is that conventional spring-based probe pins can not be used in a kelvin test. Kelvin tests are used to accurately measure the voltage across a device by minimizing the impact of contact resistance on the device.

FIG. 3 shows a block diagram that illustrates an example of a prior-art kelvin test apparatus 300, used to measure the impedance of device 310. As shown in FIG. 3, apparatus 300 includes a device 310, such as a winding, which has an input IN and an output OUT. In addition, apparatus 300 has a voltmeter 312 and a current source 314 that are connected between the input IN and the output OUT of device 310.

In operation, to measure device 310, a test current I is passed through device 310, and the resulting voltage produced across device 310 is measured. A kelvin test allows the voltage to be accurately measured because the impedance of voltmeter 312 is very high (effectively allowing the lead-line and contact resistance to be neglected). The impedance of device 310 can then be determined by dividing the voltage by the current.

Thus, to perform a kelvin test on a bumped die package, two separate contacts must be made with a solder bump: one to provide current and one to measure voltage. Since spring-based probe pins are axially aligned with the solder bumps to contact the apexes of the solder bumps, it is not possible for two conventional spring-based probe pins to make an electrical connection with a single solder bump without severely damaging the solder bump.

Cantilever pins, on the other hand, are not axially aligned with the solder bumps on the bumped die package. Instead, cantilever pins approach the solder bumps from the side. As a result, a pair of cantilever pins can be used to contact a single solder bump, thereby allowing a kelvin test to be performed.

One disadvantage of cantilever pins, however, is that the cantilever pins can significantly damage the solder bumps when the cantilever pins and solder bumps are brought into contact. Since cantilever pins approach the solder bumps from the side, it is not uncommon for a cantilever pin to first make contact with a solder bump, and then undesirably scratch across the surface of the solder bump as the full contact force is applied to make the electrical connection.

Thus, there is a need for an approach to testing bumped die packages that minimizes damage to the solder bumps while at the same time allowing a kelvin test to be performed.

DETAILED DESCRIPTION OF THE INVENTION

Figure 1:
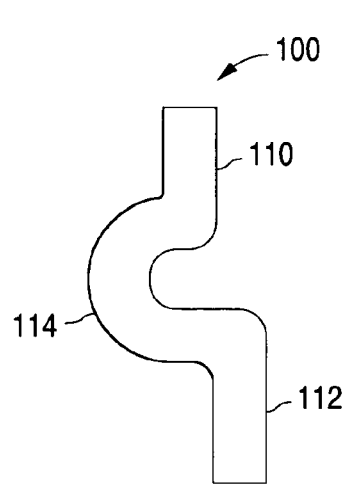
FIG. 1 is a cross-sectional diagram illustrating an example of a prior-art, non-cylindrical, spring-based probe pin 100.
Figure 2:
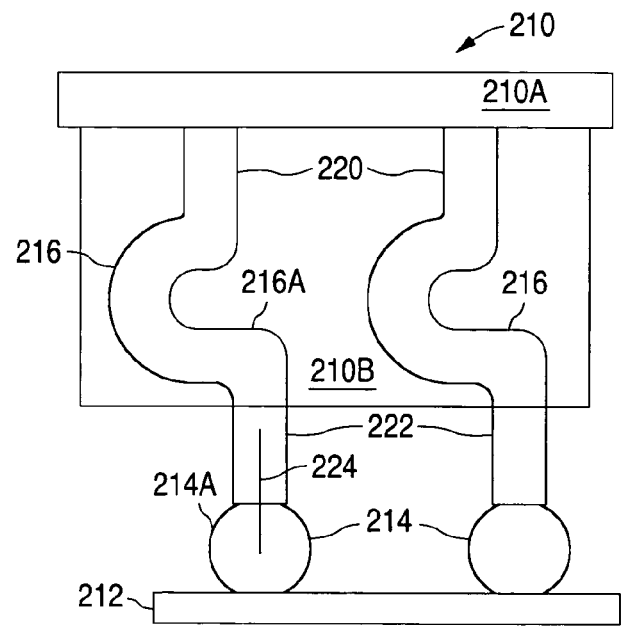
FIG. 2 is a cross-sectional diagram illustrating an example of a prior-art electrical test.
Figure 3:
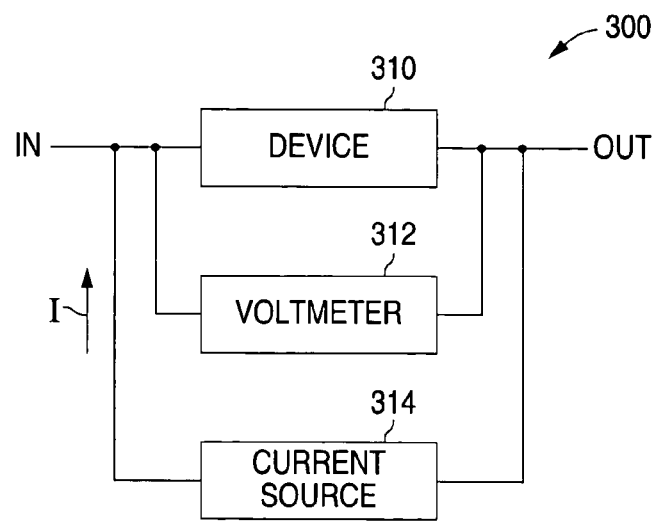
FIG. 3 is a block diagram illustrating an example of a prior-art kelvin test apparatus 300.
Figure 4:
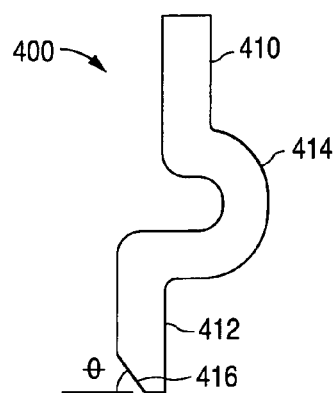
FIG. 4 is a cross-sectional diagram illustrating an example of a spring-based probe pin 400 in accordance with the present invention.

FIG. 4 shows a cross-sectional diagram that illustrates an example of a spring-based probe pin 400 in accordance with the present invention. As described in greater detail below, by offsetting and tapering the lower end section of a spring-based probe pin, multiple pins can be connected to a single solder bump, thereby allowing a kelvin test to be performed.

As shown in the FIG. 4 example, probe pin 400 is implemented as a single metal element that has a top end section 410, a bottom end section 412, and a C-shaped section 414 that connects sections 410 and 412 together. In addition, in accordance with the present invention, bottom end section 412 has a tapered surface 416. Tapered surface 416 is flat, and has an angle θ, such as 45°, which is selected to minimize contact damage. Other angles, as well as a curved surface that generally matches the surface of a solder bump, can also be used to form tapered surface 416.

Figure 5:
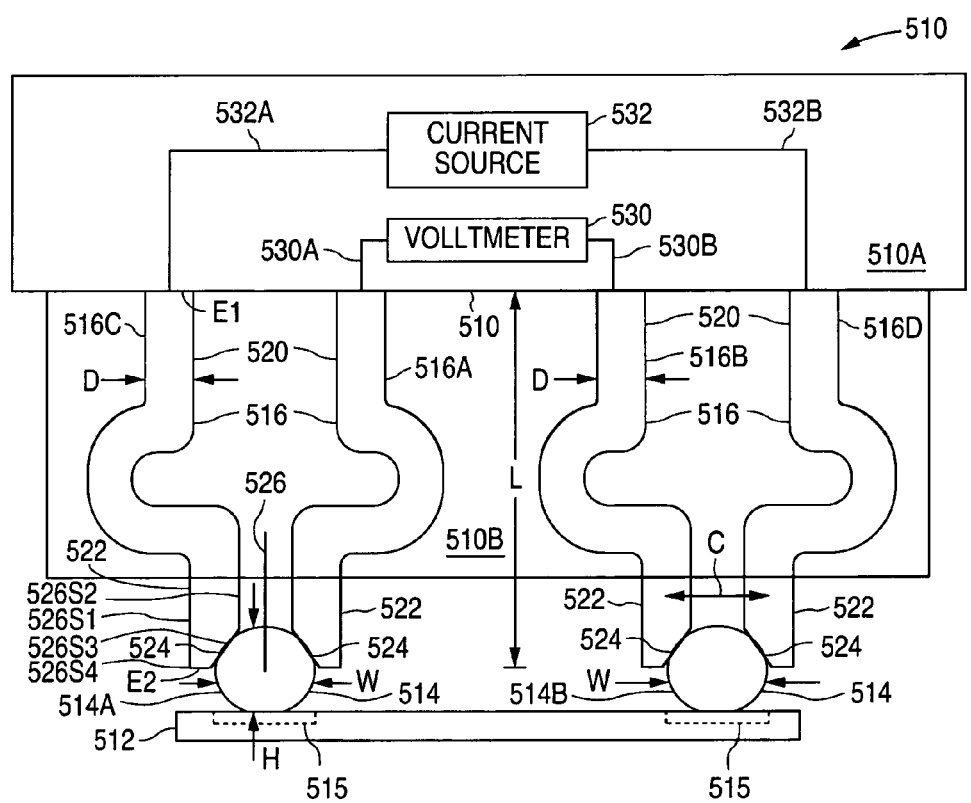
FIG. 5 is a cross-sectional diagram illustrating an example of an electrical test in accordance with the present invention.

FIG. 5 shows a cross-sectional diagram that illustrates an example of an electrical test in accordance with the present invention. As shown in FIG. 5, a test and evaluation circuit 510 is utilized to verify the electrical operation of the circuits on a wafer 512, which has a large number of contact bumps 514, such as solder or gold-based bumps, attached to the bond pads 515 of wafer 512.

Test and evaluation circuit 510, in turn, includes a printed circuit board (PCB) 510A, a socket 510B that is connected to PCB 510A, and a large number of probe pins 516 that are connected to PCB 510A and socket 510B. Each probe pin 516, in turn, is implemented as a probe pin 400, and has a top end section 520 that is electrically connected to PCB 510A, and a bottom end section 522 that is formed to have a tapered surface 524. In addition, each probe pin 516 has a length L, a first end E1 that is electrically connected to printed circuit board 510A, and a second end E2 that lies a greatest distance from printed circuit board 510A. Further, each probe pin 516 also has a first surface 526S1, a second surface 526S2, a third surface 526S3, and a fourth surface 526S4. First surface 526S1 extends along a portion of the length L to the second end E2, and lies completely within a single plane. Second surface 526S2 lies opposite first surface 526S1 and extends along a portion of the length L. In addition, first and second surfaces 526S1 and 526S2 are substantially parallel. Third surface 526S3 extends from second surface 526S2 to the second end E2 so that no portion of third surface 526S3 is substantially parallel to first surface 526S1, and no portion of third surface 526S3 is substantially orthogonal to first surface 526S1. Fourth surface 526S4 contacts the first and third surfaces 526S1 and 526S3 and lies substantially orthogonal to first surface 526S1.

In accordance with the present invention, the bottom end sections 522 are axially offset from the apexes of the contact bumps 514 so that the tapered surfaces 524 contact the top-side surfaces of the contact bumps 514. As a result, a line 526 that passes through the center and apex of a contact bump 514 does not pass through a probe pin 516.

In the example shown in FIG. 5, a contact bump 514 is illustrated as flattened spheres with a width W of 0.3048 mm (12 mils) and a height H of 0.2286 mm (9 mils), while probe pins 516 have a diameter D of 0.2032 mm (8 mils). (Although contact bumps 514 are illustrated as flattened spheres, contact bumps can alternately be implemented with other dimensions and shapes, such as hemispheres where the flat portion of the hemisphere contacts wafer 512.)

As further illustrated in FIG. 5, test and evaluation circuit 510 includes a voltmeter 530 and a current source 532 that are connected to PCB 510A. Voltmeter 530 has a first terminal 530A that is connected to a first probe pin 516A, and a second terminal 530B that is connected to a second probe pin 516B. In addition, current source 532 that has a first terminal 532A that is connected to a third probe pin 516C and a second terminal 532B that is connected to a fourth probe pin 516D.

Thus, the present invention allows a kelvin test to be performed on the circuit elements on a wafer 512 by utilizing a pair of probe pins 516 which have tapered surfaces 524 that face each other. In the FIG. 5 example, the bottom end sections 522 of the pairs of probe pins 516 have a center-to-center spacing C of 0.3048 mm (12 mils).

In operation, when a force is applied to bring first and third probe pins 516A and 516C into electrical contact with a first contact bump 514A, and second and fourth probe pins 516B and 516D into electrical contact with a second contact bump 514B, the voltage at the respective bumps can be accurately measured or controlled using a kelvin contact.

Figure 6:
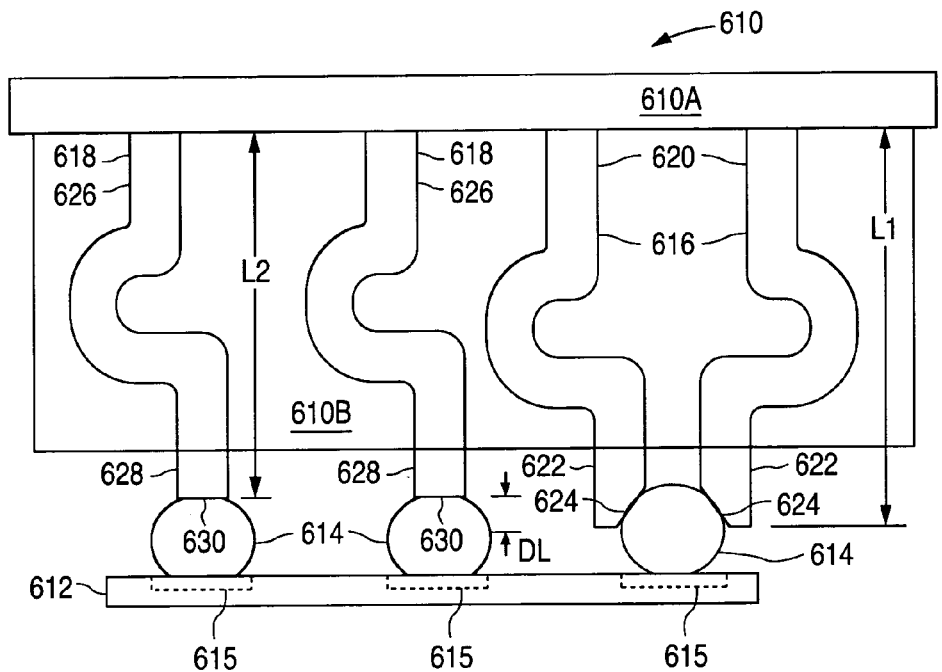
FIG. 6 is a cross-sectional diagram illustrating an example of an electrical test in accordance with the present invention.

FIG. 6 shows a cross-sectional diagram that illustrates an example of an electrical test in accordance with the present invention. As shown in FIG. 6, a test and evaluation circuit 610 is utilized to verify the electrical operation of the circuits on a wafer 612, which has a large number of contact bumps 614 attached to the bond pads 615 of wafer 612.

Test and evaluation circuit 610, in turn, includes a printed circuit board (PCB) 610A, and a socket 610B that is connected to PCB 610A. In addition, test and evaluation circuit 610 includes a large number of probe pins 616 and a large number of probe pins 618 that are electrically connected to PCB 610A.

Each probe pin 616, in turn, is implemented as a probe pin 400, and has a top end section 620 that is electrically connected to PCB 610A, and a bottom end section 622 that is formed to have a tapered surface 624. Like probe pins 616, probe pins 618 have a top end section 626 that is electrically connected to PCB 610A, and a bottom end section 622 with a non-tapered surface 630 that is connected to a contact bump 614 during a test. In the FIG. 6 example, non-tapered surface 630 is substantially normal to the longitudinal axis of probe pins 618.

In accordance with the present invention, probe pin 616 has a length L1, while probe pin 618 has a length L2 that is shorter than length L1 by a delta length DL. In the example shown in FIG. 6, probe pin 616 is longer that probe pin 618 by a delta length DL of 0.1143 (4.5 mils).

One of the advantages of test and evaluation circuit 610 is that test and evaluation circuit 610 allows the circuit devices which require kelvin-based tests (e.g., impedance tests for devices with an impedance of less than one ohm) and the circuit devices which do not require kelvin-based tests to be contacted and tested at the same time.

In addition, test and evaluation circuit 610 allows a bumped die package (or flip chip type package) to be laid out so that the contact bumps 614 which are connected to the circuit devices which do not require a kelvin-based test can be laid out with a closer pitch than the contact bumps 614 which are connected to circuit devices which do require a kelvin-based test.

Another advantage of the present invention is that the present invention reduces the force applied to the contact bumps 614 from the probe pins 616. Not only do the C-shaped portions of the probe pins 616 and 618 absorb some of the contact force, but the tapered surfaces 624 of the probe pins 616 further reduce the magnitude of the contact force applied to the contact bumps 614.

Figure 7:
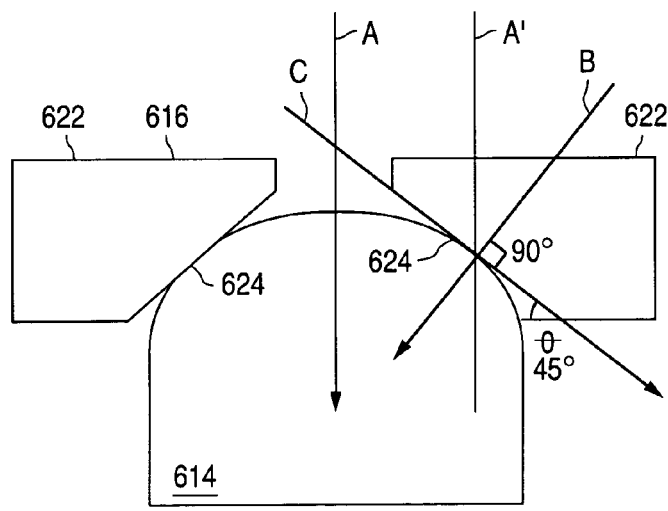
FIG. 7 is a force diagram illustrating the reduction in force applied to the probe pins 616 in accordance with the present invention.

FIG. 7 shows a force diagram that illustrates the reduction in force applied to the probe pins 616 in accordance with the present invention. As shown in FIG. 7, a probe pin 618 makes contact with the surface of contact bump 614 at a 90° angle along a vector A, which has a parallel vector A'. As such, the bump contact areas are under the full force of the probe pins 618, which is commonly 0.2 N to ensure a good connection.

As further shown in FIG. 7, when the tapered surfaces of probe pins 616 have a 45° angle, the actual force applied to the surface of contact bump 614 can be split into vectors B and C. The force of vector B directly impacts the surface of contact bump 614 at a 90° angle which, in this example, applies a force of 0.14 N.

On the other hand, the force of vector C provides a sheering force (of 0.14 N in this example) that advantageously scrubs off oxide or other contaminants from the surface of contact bump 614 when contact is made. Further, in addition to cleaning the surface of contact bump 614, the force of vector C also creates a self-cleaning effect that continuously cleans the tapered surfaces 624 of the probe pins 616.

As a result, the present invention allows a kelvin test to be performed on a bumped die package (or a similar flip chip type die package) with a spring-based, tapered-end probe pin that reduces the contact force and resulting damage that a contact bump can experience as a result of making the electrical contact.

Thus, a test and evaluation circuit has been described that allows spring-based probe pins, which reduce contact damage to the contact bumps, to be used to determine or control the voltage at a device bump with a kelvin contact. In addition, using two types of probe pins allows only those circuit devices which require a kelvin test to be contacted with tapered probe pins.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A test and evaluation circuit comprising:
   a current sourcing circuit having an input and an output;
   a voltage measuring circuit having an input and an output that measures a voltage across the input and the output of the voltage measuring circuit;
   a first conductive probe pin electrically connected to the input of the current sourcing circuit; and
   a second conductive probe pin electrically connected to the input of the voltage measuring circuit, the inputs of the current sourcing circuit and the voltage measuring circuit being electrically connected together when the first conductive probe pin and the second conductive probe pin are in physical contact with a single conductive bump, the inputs of the current souring circuit and the voltage measuring circuit being electrically isolated from each other when the first conductive probe pin and the second conductive probe pin are electrically isolated from each other.

2. The test and evaluation circuit of claim 1 wherein the single conductive bump is connected to a bond pad.

3. The test and evaluation circuit of claim 1 and further comprising:
   a third conductive probe pin electrically connected to the output of the current sourcing circuit; and
   a fourth conductive probe pin electrically connected to the output of the voltage measuring circuit, the third conductive probe pin and the fourth conductive probe pin being electrically connected together when the third conductive probe pin and the fourth conductive probe pin are in contact with one conductive bump, and are electrically isolated from each other when the third conductive probe pin and the fourth conductive probe pin are removed from said one conductive bump.

4. The test and evaluation circuit of claim 3 wherein the first and third conductive probe pins contact different conductive bumps.

5. The test and evaluation circuit of claim 1 and further comprising:
   a printed circuit board, the first conductive probe pin being electrically connected to the printed circuit board, the first conductive probe pin having a first length, the second conductive probe pin being electrically connected to the printed circuit board, the second conductive probe pin having the first length; and
   a third conductive probe pin electrically connected to the printed circuit board to contact a single conductive bump, the third conductive probe pin having a second length, the first length being greater than the second length.

6. The test and evaluation circuit of claim 1 wherein the first conductive probe pin, the second conductive probe pin and the third conductive probe pin contact a conductive bump at substantially a same time.

7. The test and evaluation circuit of claim 1 and further comprising a fourth conductive probe pin electrically connected to the printed circuit board, the fourth conductive probe pin to contact a single conductive bump, the fourth conductive probe pin having the second length.

8. The test and evaluation circuit of claim 1 wherein:
   the first conductive probe pin has:
      a length extending from a first end to a second end;
      a first surface extending along a portion of the length to the second end, and lying completely within a single plane;
      a second surface opposite the first surface extending along a portion of the length, the first and second surfaces being substantially parallel; and
      a third surface extending from the second surface to the second end, the third surface lying completely within a single plane, no portion of the third surface being substantially parallel to the first surface, no portion of the third surface being substantially orthogonal to the first surface.

9. The test and evaluation circuit of claim 8 wherein the first conductive probe pin has a fourth surface that contacts the first and third surfaces and lies substantially orthogonal to the first surface.

10. The test and evaluation circuit of claim 8 wherein the second conductive probe pin has:
   a length extending from a first end to a second end;
   a first surface extending along a portion of the length of the second conductive probe pin to the second end of the second conductive probe pin, and lying completely within a single plane;
   a second surface opposite the first surface of the second conductive probe pin extending along a portion of the length of the second conductive probe pin, the first and second surfaces of the second conductive probe pin being substantially parallel; and
   a third surface extending from the second surface of the second conductive probe pin to the second end of the second conductive probe pin, no portion of the third surface of the second conductive probe pin being substantially parallel to the first surface of the second conductive probe pin, no portion of the third surface of the second conductive probe pin being substantially orthogonal to the first surface of the second conductive probe pin.

11. The test and evaluation circuit of claim 10 wherein the third surface of the first conductive probe pin and the third surface of the second conductive probe pin face each other.

12. The test and evaluation circuit of claim 10 wherein the third surface of the first conductive probe pin and the third surface of the second conductive probe pin do not contact an apex of the single conductive bump during a test.

13. The test and evaluation circuit of claim 10 wherein each conductive probe pin has a top end segment electrically connected to the printed circuit board, a bottom end segment that includes the first, second, and third surfaces, and a central segment that connects the top and bottom end segments together, the central segment having a vertical spring action.

14. The test and evaluation circuit of claim 8 wherein no portion of the second surface contacts the single conductive bump when the first conductive probe pin contacts the single conductive bump.

* * * * *

UNITED STATES PATENT AND TRADEMARK OFFICE
CERTIFICATE OF CORRECTION

PATENT NO. : 7,271,606 B1 Page 1 of 1
APPLICATION NO. : 11/197916
DATED : September 18, 2007
INVENTOR(S) : Tang et al.

It is certified that error appears in the above-identified patent and that said Letters Patent is hereby corrected as shown below:

<u>Column 6,</u>

Line 21, delete "1" and replace with --5--.

Line 25, delete "1" and replace with --5--.

Signed and Sealed this

Eighteenth Day of December, 2007

JON W. DUDAS
*Director of the United States Patent and Trademark Office*